United States Patent
Lee

(10) Patent No.: US 6,392,452 B2
(45) Date of Patent: *May 21, 2002

(54) INPUT BUFFER CIRCUIT FOR RF PHASE-LOCKED LOOPS

(75) Inventor: Sang-Oh Lee, Seoul (KR)

(73) Assignee: Samsung Electronics Co., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/481,158

(22) Filed: Jan. 12, 2000

(30) Foreign Application Priority Data

Jan. 13, 1999 (KR) .................................................. 99-654

(51) Int. Cl.[7] .............................. H03B 1/00; H03K 3/00
(52) U.S. Cl. ...................... 327/108; 327/478; 327/432; 327/563; 327/103; 327/65; 326/89; 326/82; 330/252
(58) Field of Search ............................. 327/63, 65, 66, 327/103, 108–112, 432, 563, 427, 478; 326/26, 27, 82–84, 85; 330/311, 252, 254

(56) References Cited

U.S. PATENT DOCUMENTS

| | | | | |
|---|---|---|---|---|
| 3,723,895 A | * | 3/1973 | Peil | 330/254 |
| 4,797,586 A | * | 1/1989 | Traa | 327/276 |
| 5,510,734 A | * | 4/1996 | Sone | 327/91 |
| 5,914,630 A | * | 6/1999 | Peterson | 327/65 |
| 6,069,522 A | * | 5/2000 | Venkatraman et al. | 327/52 |
| 6,072,351 A | * | 6/2000 | Sharpe-Geisler | 327/112 |
| 6,084,469 A | * | 7/2000 | Lorenz | 330/252 |
| 6,104,226 A | * | 8/2000 | Weber | 327/359 |

OTHER PUBLICATIONS

Mizuno, Moriaki, et al., "A 3–mW 1.0–Ghz Silicon–ECL Dual–Modulus Presaler IC," IEEE Journal of Solid–State Circuits, vol. 27, No. 12, Dec. 1992, pp. 1794–1798.

Gray, P.R., Meyer, R.G., "Analysis and Design of Analog Integrated Circuits," published in 1992, Wiley, New York, pp. 424–431.

* cited by examiner

Primary Examiner—Terry D. Cunningham
Assistant Examiner—Long Nguyen
(74) Attorney, Agent, or Firm—Mills & Onello, LLP

(57) ABSTRACT

An input buffer circuit includes a first amplifier having low load impedance and a second amplifier having high load impedance. The output signals of the input buffer circuit have wide bandwidth, although the input buffer circuit has two stage amplifiers. In addition, the bandwidth can be controlled by resistors as an equivalent active inductance of the input buffer circuit. Further, the input buffer circuit can reduce the power consumption compared with conventional input buffer circuits, since the input buffer circuit according to the present invention uses a first switching current of the first amplifier as well as a second switching current of the second amplifier to load output signals.

17 Claims, 6 Drawing Sheets

INPUT BUFFER CIRCUIT FOR RF PHASE-LOCKED LOOPS

FIELD OF THE INVENTION

The present invention relates to a communication system, and more particularly to an input buffer circuit for radio frequency (RF) phase-locked loops(PLLs).

BACKGROUND OF THE INVENTION

Communication systems for connecting persons to allow them to transmit and receive information back and forth are becoming increasingly powerful. In fact, certain types of systems, such as modems for performing data communication and telephones for performing voice communication, have become indispensable to many users. Generally, communication systems are classified as either wired communication systems which use data transmission lines or wireless communication systems which transmit data using electromagnetic transmissions such as radio frequency (RF) transmissions.

In portable systems that include wireless communication capability, such as pagers, cellular telephones, personal communication service (PCS) phones, personal digital assistants (PDA), and portable computers including laptops and notebook computers, there are several important considerations. These include battery life and, therefore, power consumption, as well as the weight and volume of the system. These factors are all affected by the size and type of integrated circuits that make up the systems in general and their resident communication systems in particular. The size and type of traditionally external components is also an important factor. With the developments made in integrated circuit technology, more and more components which were traditionally considered external components are being embedded in integrated circuits.

FIG. 1 is a block diagram illustrating a conventional communication receiver 100. Referring to FIG. 1, the communication receiver 100 comprises an antenna 1, a speaker 2, a radio frequency (RF) amplifier 10, a mixer 20, an intermediate frequency (IF) amplifier 30, a base band analog processor (BBA) 40, and an RF phase-locked loop (PLL) 95. The PLL 95 includes a voltage-controlled oscillator VCO 50, a frequency divider 75, a phase detector 80 and a filter 90.

The RF amplifier 10 amplifies an RF signal having radio band frequency received from the antenna 1. The mixer 20 mixes the RF signal from the RF amplifier 10 with an oscillating signal generated by the VCO 50 to generate an intermediate frequency (IF) signal having intermediate band frequency. The IF amplifier 30 amplifies the IF signal from the mixer 20. The BBA processor 40 receives the IF signal from the IF amplifier 30 and converts the IF signal to a base band analog (BBA) signal having base band frequency. The BBA signal is provided as an output to the speaker 2.

Generally, phase-locked loops (PLL) can be classified according to their frequency characteristics as radio frequency (RF) phase-locked loops, such as PLL 95 in FIG. 1, and low frequency (LF) PLLs. For example, referring to FIG. 2, which is a detailed block diagram illustrating the RF PLL 95 shown in FIG. 1., recent mobile telecommunication systems such as the cellular phone and the PCS phone use an RF PLL 95 having a prescaler 60 as a principal part of their systems. The LF PLL does not require a prescaler, since the LF PLL is operated at low frequency.

Referring to FIG. 2, the RF PLL 95 comprises the VCO 50, the phase detector 80, the filter 90 and the frequency divider 75, which includes the prescaler 60 and a divider 70. In the RF PLL 95 shown in FIG. 2, the VCO 50 generates an oscillating signal having the radio band frequency. The frequency divider 75 divides the frequency of the oscillating signal from the VCO 50 by a predetermined divisor, for example, N, and outputs a divided oscillating signal Ffeed to the phase detector 80. The prescaler 60 is used for pre-dividing the frequency of the oscillating signal from the VCO 50, and the divider 70 is used for dividing the pre-divided oscillating signal from the prescaler 60.

The prescaler 60 divides the oscillating signal, typically having a frequency in the Gigahertz (GHz) range, and outputs a pre-divided oscillating signal, typically having a frequency in the tens of Megahertz (MHz), to the divider 70. The divider 70 divides the pre-divided oscillating signal and outputs a further divided oscillating signal to the phase detector 80. The prescaler 60 typically includes emitter coupled logic (ECL) circuitry which is applicable for high speed operation.

The phase detector 80 compares a reference input signal Fref having a reference frequency with the divided oscillating signal Ffeed from the frequency divider 75, to generate a control signal which is applied to the VCO 50 through the filter 90, so as to control the VCO 50.

The prescaler 60 composed of the ECL circuitry, comprises an input buffer circuit for amplifying the low-level oscillating signal to the ECL level. The input buffer circuit is capable of operating in the Ghz frequency range and is used to provide a wide input sensitivity to the prescaler 60. One example of the input buffer circuit for the ECL prescaler is set forth in a paper entitled, "A 3-mW 1.0-Ghz Silicon-ECL Dual-Modulus Prescaler IC", by Moriaki Mizuno, Hirokazu Suzuki, Masami Ogawa, Kouji Sato, and Hiromich Ichikawa, published in the December, 1992 issue of IEEE JOURNAL OF SOLID STATE CIRCUITS, vol. 27, No. 12, pages 1794–1797.

FIG. 3 is a circuit diagram which illustrates an input buffer circuit 65 included in the prescaler 60 shown in FIG. 2, and which is disclosed in the above paper. Referring to FIG. 3, the input buffer 65 comprises a first amplifier 61, a second amplifier 62, and a output driving circuit 63. The first amplifier 61 receives an oscillating signal IN and an inverted oscillating signal INB from the VCO 50. The input signals IN and INB have 50 mV–0.5V of peak voltage, and a high frequency response of more than 1 GHz. Transistors Q1, Q2, Q3 and Q4 are included in the first and the second amplifiers 61 and 62. They operate as switches when the voltage of the input signal IN is higher than 100 mV, for example, and operate as amplifiers when the voltage of the input signal IN is 50 mV or less, for example. The bandwidths of output signals OUT and OUTB of the input buffer circuit 65 are restricted by parasitic capacitances existing on nodes N1, N2, N3 and N4, and load resistors RL1, RL2, RL3 and RL4. The output signals OUT and OUTB are digitized by the switching operation of the transistors Q1, Q2, Q3 and Q4, and then they are outputted to the phase detector 80 through the output driving circuit 63.

FIG. 4 is a diagram illustrating simulated output characteristics of the input buffer 65 shown in FIG. 3. The plot of FIG. 4 illustrates a characteristic of the input buffer generated by a computer simulation, such as SPICE, with circuit parameters set as follows: VDD=3V, VBB1=1.5V, RL3=RL4=1.75 k$\Omega$, IEE1=IEE2=200 $\mu$A, and IEE3=IEE4=50 $\mu$A. The simulated frequency response with this current has adequate gain (for example, 14 dB) up to 1.0 Ghz as shown in FIG. 4. The output characteristics of the input buffer 65 will be described in detail below, including comparing them with the output characteristics of an input buffer according to an embodiment of the present invention.

To obtain the output characteristics illustrated in FIG. 4, switching voltages across load resistors RL1, RL2, RL3 and RL4 must be kept above 300 mV in the input buffer circuit 65, so as to satisfy the ECL output characteristics. That is, the first and the second switching voltages obtained by multiplying a first switching current IEE1 and the respective load registers RL1 and RL2 must be kept above 300 mV in the first amplifier 61. Similarly, the third and the fourth switching voltages obtained by multiplying a second switching current IEE2 and the respective load registers RL3 and RL4 must be kept above 300 mV in the second amplifier 62.

Several problems occur in the conventional input buffer circuit 65 in connection with achieving both low power consumption and a wide bandwidth, while satisfying the above described restriction related to the switching voltages. For example, when the resistance of the load resistors RL1, RL2, RL3 and RL4 is reduced, the output bandwidth of the input buffer circuit 65 is enlarged. However, at the same time, the power consumption of the input buffer circuit 65 increases, because the switching currents IEE1 and IEE2 are increased so as to keep the switching voltages above 300 mV. Also, when the switching currents IEE1 and IEE2 are reduced, the power consumption of the input buffer circuit 65 is reduced. But, the output bandwidth of the input buffer circuit 65 becomes narrower because the resistance of the load resistors RL1, RL2, RL3 and RL4 are increased to keep the switching voltages above 300mV.

SUMMARY OF THE INVENTION

It is an object of the present invention to provide an input buffer circuit of a prescaler included in an RF PLL, having a wide bandwidth and low power consumption characteristics.

It is another object of the present invention to provide an input buffer circuit capable of controlling its output bandwidth.

In order to attain the above objects, according to an aspect of the present invention, there is provided an input buffer circuit which includes a first switching means having cascode transistors. The first switching means receives a first switching current from a power supply voltage source, switches the first switching current in response to the externally applied oscillating signal, and generates a first and a second switching signal by converting the first switching current into a first and a second switching voltage. A second switching means receives a second switching current from the power supply voltage source and switches the second switching current in response to the first and the second switching signals. A loading means generates a third and a fourth switching signal by converting both the first and the second switching currents into a third and a fourth switching voltage. An output driving means outputs a first and a second output signal in response to the third and the fourth switching signals, respectively.

According to another aspect of this invention, there is provided a cascode circuit having a first and a second resistor used as an equivalent inductance. The output bandwidth of the input buffer circuit can be controlled by the resistors.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS OF THE INVENTION

Figure 5:
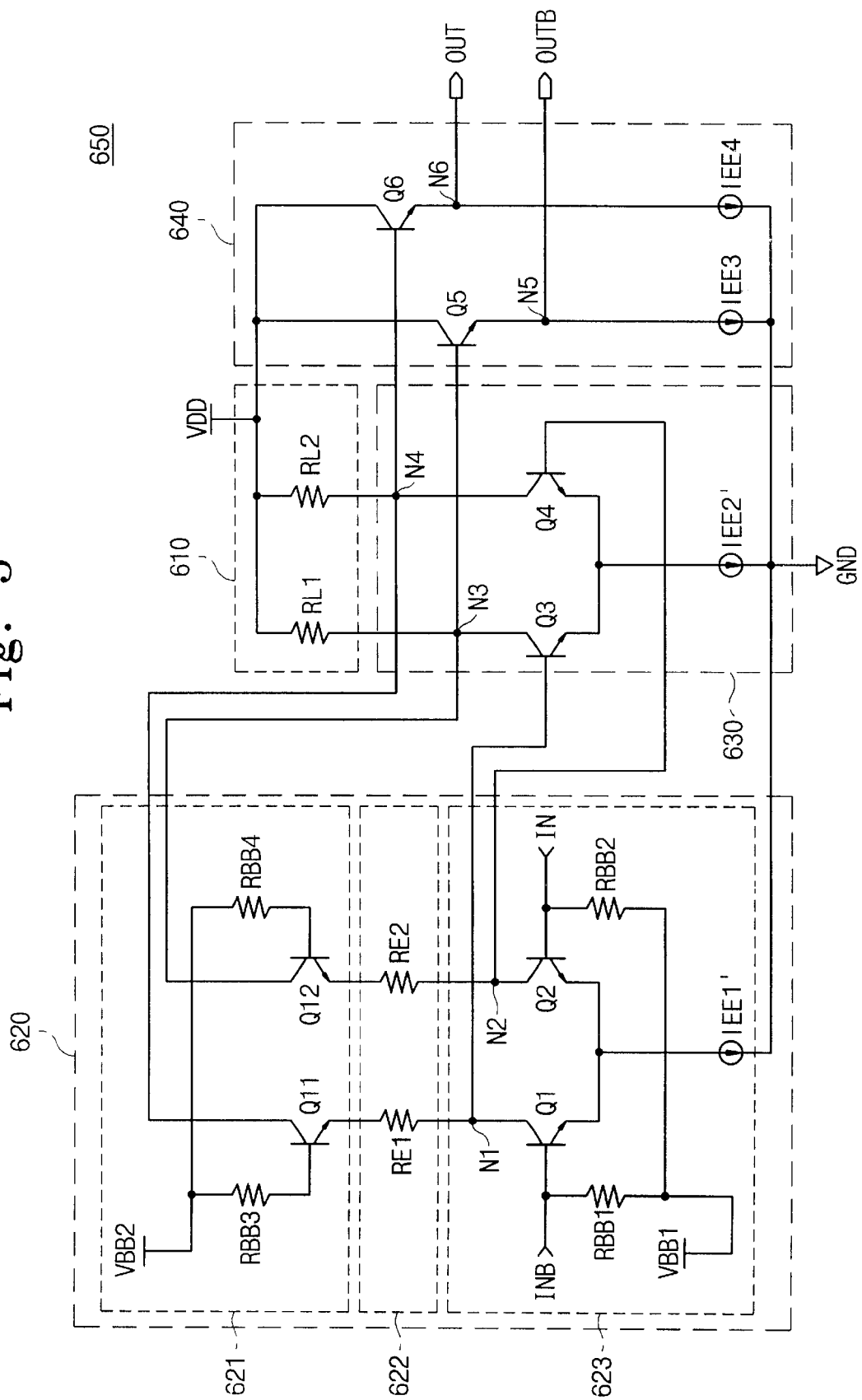
FIG. 5 is a schematic circuit diagram which illustrates one embodiment of an input buffer circuit according to the present invention.

FIG. 5 is a schematic circuit diagram which illustrates one embodiment of an input buffer circuit 650 according to the present invention. Referring to FIG. 5, the input buffer circuit 650 comprises a loading circuit 610, a first amplifier 620, a second amplifier 630, and an output driving circuit 640.

The first amplifier 620 is used for receiving a first switching current IEE1' from a power supply voltage source VDD, switching the first switching current IEE1' in response to the externally inputted oscillating signals IN and INB, and generating a first and a second switching voltage VN1 and VN2 by converting the first switching current IEE1' into the voltages.

For performing these operations, the first amplifier 620 includes a cascode circuit 621, a loading section 622, and a switching circuit 623. The circuit 621 is in cascode with the loading section 622. The circuit 621 supplies the first switching current IEE1' for the switching circuit 623 through the loading section 622, without loss. The loading section 622 generates a first and a second switching voltage VN1 and VN2 at circuit nodes N1 and N2, respectively, by converting the first switching current IEE1' into the voltages, respectively, in response to the switching operation of the switching circuit 623. The switching circuit 623 switches the first switching current IEE1', selectively, in response to externally applied oscillating signals IN and INB.

The circuit 621 in cascode with the loading section 622, includes a pair of cascode transistors Q11 and Q12 and resistors RBB3 and RBB4. The first cascode transistor Q11 has a base coupled to the resistor RBB3, a collector couple to a node N4, and an emitter. The second cascode transistor Q12 has a base coupled to the resistor RBB4, a collector coupled to a node N3, and an emitter. The resistors RBB3 and RBB4 are commonly coupled to a bias voltage source VBB2.

The loading section 622 includes two load resistors RE1 and RE2. The first load resistor RE1 is coupled between the emitter of the first cascode transistor Q11 and node N1. The second load resistor RE2 is coupled between the emitter of the second cascode transistor Q12 and node N2.

The switching circuit 623 includes two switching transistors Q1 and Q2, two resistors RBB1 and RBB2, and a constant current source IEE1'. The first switching transistor Q1 has a base coupled to the resistor RBB1 and a first input terminal for receiving an inversed oscillating signal INB from a voltage-controlled oscillator (VCO), a collector coupled to the node N1, and an emitter. The second switching transistor Q2 has a base coupled to the resistor RBB2 and a second input terminal for receiving an oscillating signal IN from the VCO, a collector coupled to the node N2, and an emitter. The emitters of the transistors Q1 and Q2 are commonly coupled to the first current source IEE1', and the resistors RBB1 and RBB2 are commonly coupled to a bias voltage source VBB1.

The second amplifier 630 receives a second switching current IEE2' from the power supply voltage source VDD and switches the second switching current IEE2' in response to the first and the second switching voltages VN1 and VN2 at nodes N1 and N2, respectively. The second amplifier 630 includes two switching transistors Q3 and Q4 and a second constant current source IEE2'. The third switching transistor Q3 has a base coupled to the node N1, a collector coupled to the node N3, and an emitter. The fourth switching transistor Q4 has a base coupled to the node N2, a collector coupled to the node N4, and an emitter. The emitters of the switching transistors Q3 and Q4 are commonly coupled to the second current source IEE2'.

The loading circuit 610 generates a third and a fourth switching voltage VN3 and VN4 at nodes N3 and N4, respectively, by changing both the first and the second switching currents IEE1' and IEE2' into the voltages, in response to the switching operation of the second amplifier 630. The loading circuit 610 includes a first loading resistor RL1 and a second loading resistor RL2. The first loading resistor RL1 is coupled between a power supply voltage source VDD and the node N3, and the second loading resistor RL2 is coupled between the power supply voltage source VDD and the node N4.

The output driving circuit 640 outputs the first and the second output signals OUT and OUTB in response to the third and the fourth switching voltages VN3 and VN4 from the loading circuit 610. The output driving circuit 640 includes two transistors Q5 and Q6 and two current source IEE3 and IEE4. The transistor Q5 has a base coupled to the node N3, a collector coupled to the power supply voltage source VDD, and an emitter coupled to a node N5. The third current source IEE3 and the first output terminal for outputting the inverted output signal OUTB of the input buffer circuit 650 are connected to the node N5. The transistor Q6 has a base coupled to the node N4, a collector coupled to the power supply voltage source VDD, and an emitter coupled to a node N6. The fourth current source IEE4 and the second output terminal for outputting the output signal OUT of the input buffer circuit 650 are connected to the node N6. In the input buffer circuit 650, the current sources IEE1', IEE2', IEE3 and IEE4 are commonly couple to a ground voltage source GND, so as to sink their respective currents.

Figure 1:
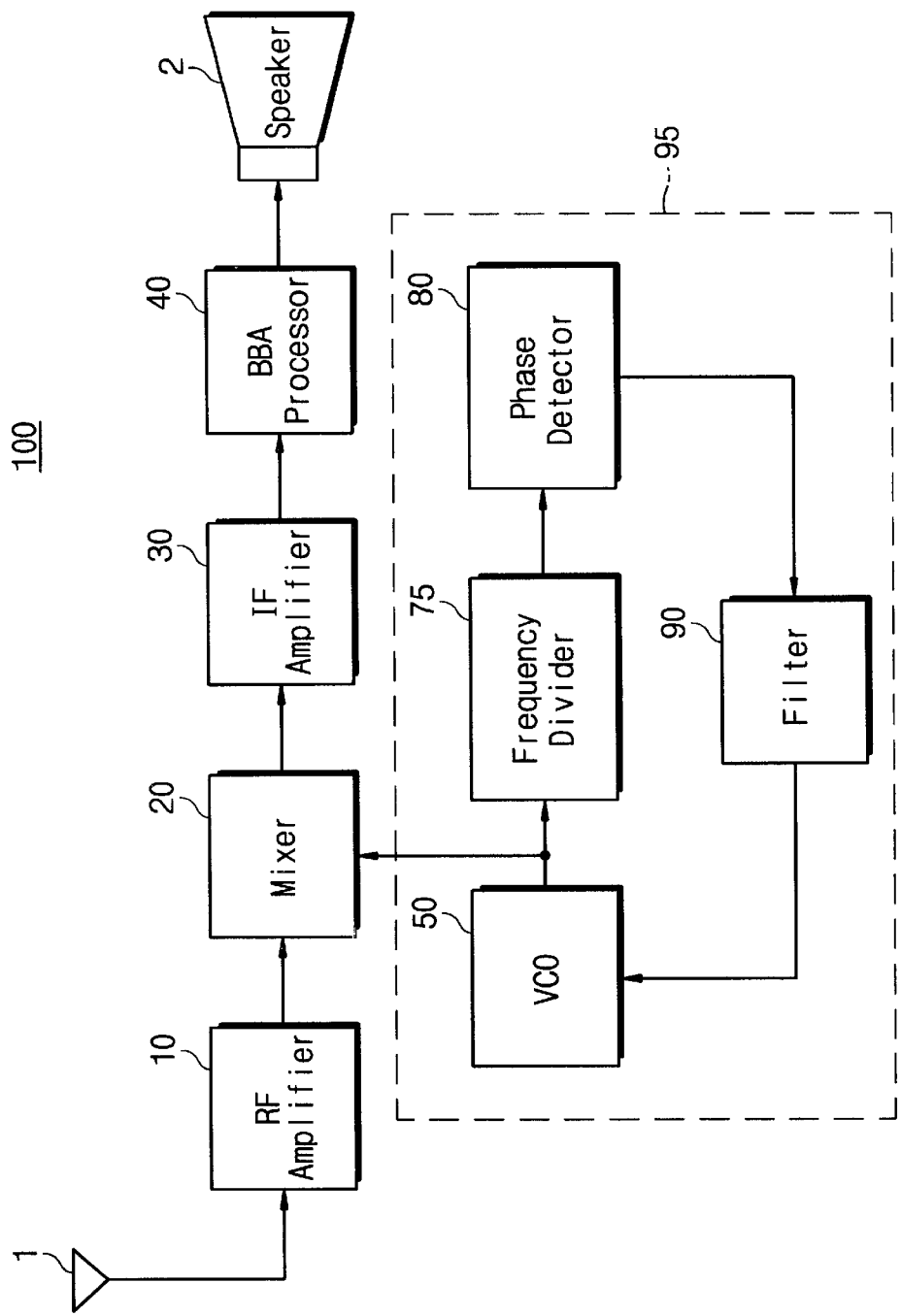
FIG. 1 is a schematic block diagram which illustrates a conventional communication receiver.
Figure 2:
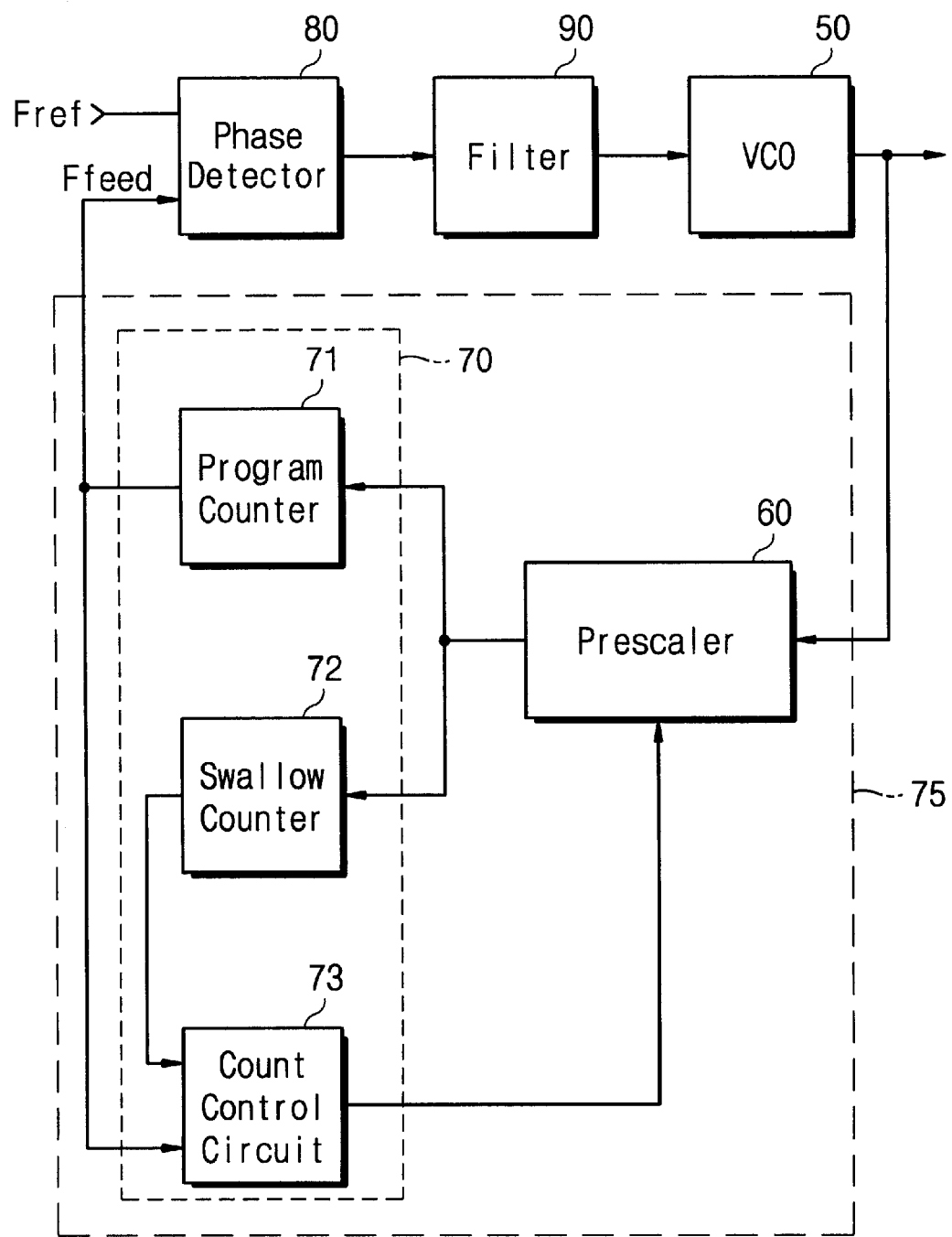
FIG. 2 is a detailed schematic block diagram which illustrates the RF PLL shown in FIG. 1.

The input buffer circuit 650 included in a prescaler amplifies the oscillating signal from the VCO (referring to FIG. 2). The first amplifier 620 of the input buffer circuit 650 compares the oscillating signal IN with the inverted oscillating signal INB and generates the first and the second switching voltages VN1 and VN2 as comparison results.

For example, it is assumed that only oscillating signal IN is applied to the base of the transistor Q2, when the transistors Q1, Q2, Q11 and Q12 are operated in an active region by the bias voltage sources VBB1 and VBB2. In addition, it is assumed that the base of the transistor Q1 is electrically grounded through a capacitor (not shown).

Before the oscillating signal IN is applied, the first and the second switching voltages VN1 and VN2 from the node N1 and N2 are described as follows:

$$VN1 = VBB2 - VBE11 - (RE1 \times IEE1'/2)$$

$$VN2 = VBB2 - VBE12 - (RE2 \times IEE1'/2) \quad (1)$$

As shown in equation (1), the switching voltages VN1 and VN2 are obtained by subtracting the base-emitter voltages of the transistors Q11 and Q12 from the bias voltage VBB2, respectively. In that case, it is assumed that respective current gains of the transistors Q11 and Q12 are sufficiently great. With these assumptions, the third and the fourth switching voltages VN3 and VN3 from the node N3 and N4 are described as follows:

$$VN3 = VDD - [\{(IEE1' + IEE2') \times RL1\}/2]$$

$$VN4 = VDD - [\{(IEE1' + IEE2') \times RL2\}/2] \quad (2)$$

As shown in equation (2), the third and the fourth switching voltages VN3 and VN4 are obtained by subtracting the voltage corresponding to the load resistors RL1 and RL2 from the power supply voltage source VDD, respectively.

Then if an oscillating signal IN swing in low level is inputted to the base of the transistor Q2, the first switching transistor Q1 is turned on and the second switching transistor Q2 is turned off, respectively. In that case, switching voltages VN1' and VN2' from the nodes N1 and N2 are described as follows:

$$VN1' = VBB2 - VBE11 - (RE1 \times IEE1')$$

$$VN2' > VBB2 - VBE12 \quad (3)$$

In the second amplifier 630, the transistors Q3 and Q4 perform switching operations in response to the first and the second switching voltages VN1' and VN2' from the nodes N1 and N2, respectively. As shown in equation (3), the first switching voltage VN1' has low voltage level, and the second switching voltage VN2' has high voltage level. Thus, the third switching transistor Q3 receiving the first switching voltage VN1' is turned off, and the fourth switching transistor Q4 receiving the second switching voltage VN2' is turned on. Therefore, the loading circuit 610 generates switching voltages VN3' and VN4' from the nodes N3 and N4 in response to the switching operation of the second amplifier 630, as described in equation (4).

$$VN3' = VDD$$

$$VN4' = VDD - \{RL2 \times (IEE1' + IEE2')\}$$

As shown in equation (4), the loading circuit 610 according to the present invention uses the first switching current IEE1' as well as the second switching current IEE2' to generate the switching voltages VN3' and VN4'. The summation of the first and the second switching currents, i.e., IEE1'+IEE2', across the second load register RL2 is equal to the switching current IEE2 of the conventional input buffer circuit 65 shown in FIG. 3. Thus, the input buffer circuit 650 can reduce the power consumption about two times compared with the conventional input buffer circuit 65, since the loading circuit 610 reuses the first switching current IEE1' to generate the switching voltages VN3' and VN4', which will be described in detail below.

The third and the fourth switching voltages VN3' and VN4' are applied to the base of the transistors Q5 and Q6 of the output driving circuit 640, respectively. The transistors Q5 and Q6 output the switching voltages VN3' and VN4' after lowering them by the base-emitter voltage of the transistors Q5 and Q6. As described above, the third switching voltage VN3' has high voltage level, and the fourth switching voltage VN4' has low voltage level, so that the output driving circuit 640 outputs the first output signal OUTB having high voltage level, and second output signal OUT having low voltage level.

In contrast, if an oscillating signal IN swing in high level is applied to the base of the transistor Q2 when the nodes N1, N2, N3 and N4 have such output voltages VN1, VN2, VN3 and VN4, respectively, the first switching transistor Q1 is turned off and the second switching transistor Q2 is turned on in response to the oscillating signal IN. In that case, the first amplifier 620 generates switching voltages VN1" and VN2" as described in equation (5).

$$VN1" > VBB2 - VBE11$$

$$VN2" = VBB2 - VBE12 - (RE2 \times IEE1') \quad (5)$$

In the second amplifier 630, the switching transistors Q3 and Q4 perform switching operations in response to the switching voltages VN1" and VN2" from the nodes N1 and N2, respectively. Thus, the third transistor Q3 is turned on and the fourth transistor Q4 is turned off. Therefore, the load circuit 610 generates switching voltages VN3" and VN4" as described in equation (6), in response to the switching operation of the second amplifier 630.

$$VN3" = VDD - \{RL1 \times (IEE1' + IEE2')\}$$

$$VN4" = VDD \quad (6)$$

The third and the fourth switching voltages VN3" and VN4" are applied to the base of the transistors Q5 and Q6 of the output driving circuit 640, respectively. The transistors Q5 and Q6 output the switching voltages VN3" and VN4" after lowering them by the base-emitter voltage of the transistors Q5 and Q6. As shown in equation (6), the third switching voltage VN3" has low voltage level, and the fourth switching voltage VN4" has high voltage level, so that the output driving circuit 640 outputs the first output signal OUTB having low voltage level, and second output signal OUT having high voltage level.

For performing above described operations, the loading circuit 610 reuses the first switching current IEE1' with the second switching current IEE2' to load the third and the fourth switching voltages VN3, VN4, VN3', VN4', VN3" and VN4" into the output driving circuit 640. Thus, the input buffer circuit 650 can reduce the current consumption about two times compared with the conventional input buffer circuit.

Figure 3:
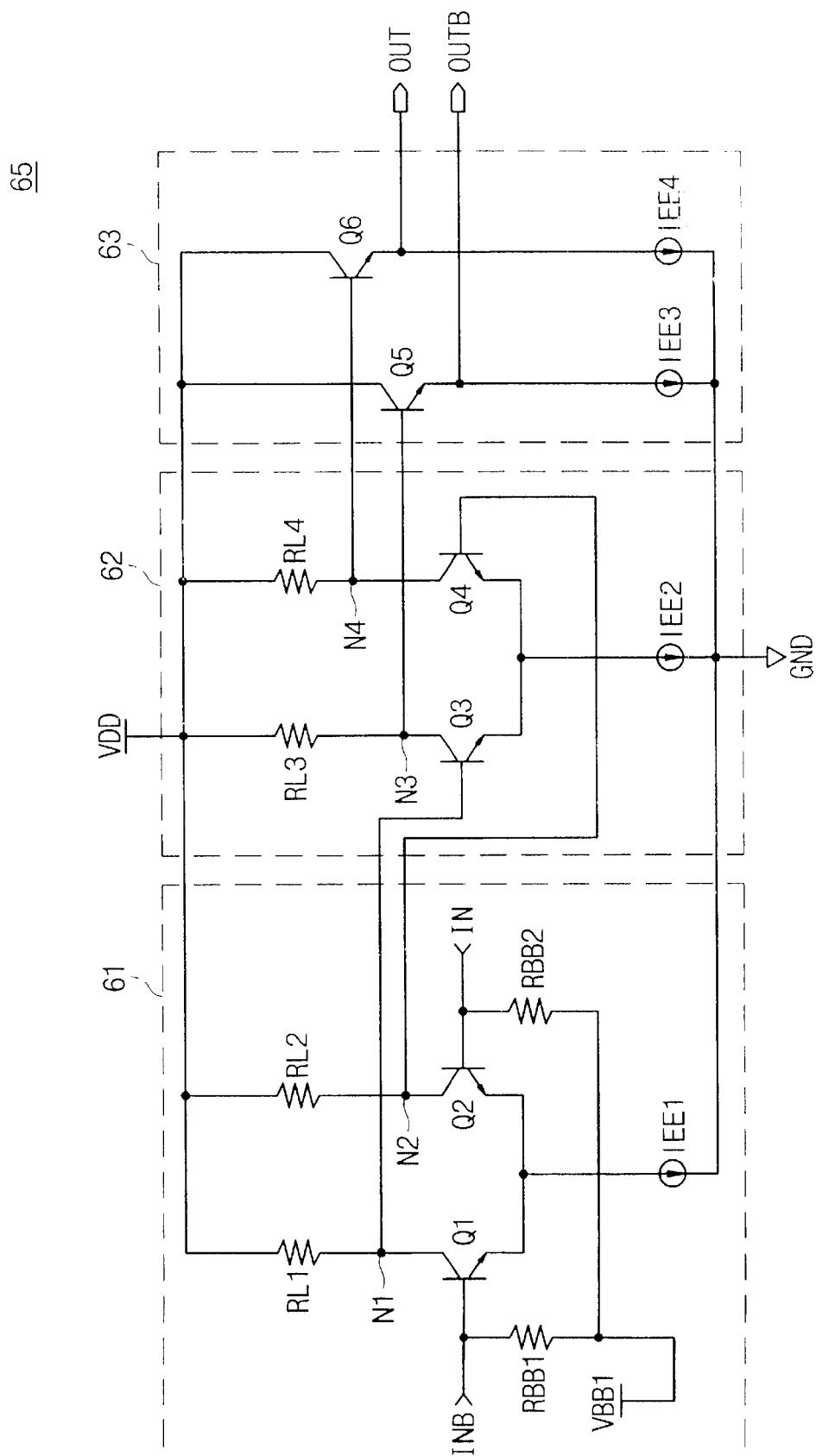
FIG. 3 is a schematic circuit diagram which illustrates an input buffer circuit included in the prescaler shown in FIG. 2.

For example, when the load resistors RL1, RL2, RL3 and RL4 of the conventional input buffer circuit 65 shown in FIG. 3, and the load resistors RL1 and RL2 of the input buffer circuit 650 according to the present invention are 1 kΩ, respectively, assume that the respective switching voltages corresponding to the load resistors of the conventional input buffer circuit 65 and the input buffer circuit 650 are 300 mV. In the conventional input buffer circuit 65, the currents through the load registers RL1, RL2, RL3 and RL4 are 150 μA, respectively. Thus, the conventional input buffer circuit 65 consumes 600 μA during the switching operations of the first and the second amplifier 61 and 62. Otherwise, in the input buffer circuit 650, the currents through the load registers RL1 and RL2 are 150 μA, respectively. Thus, the input buffer circuit 650 according to the present invention consumes 300 μA during the switching operations of the first and the second amplifier 620 and 630. Therefore, the input buffer circuit 650 according to the present invention can reduce the power consumption by about half compared with the conventional input buffer circuit 65.

In addition, the resistors RBB3 and RBB4 are used as equivalent inductance when the frequency is increased, so that the output bandwidth of the output signals OUT and OUTB can be enlarged by controlling the resistors RBB3 and RBB4. This inductance effect realized by resistors is disclosed generally in "Analysis and Design of Analog Integrated Circuits," by P. R. Gray and R. G. Meyer, published in 1992, Wiley, New York, pages 424–431. The input buffer circuit 650 can output the output signals OUT and OUTB having wide bandwidth by forming a low impedance base-emitter voltage VBE loop, when the transistors Q11 and Q12 of the first amplifier 620 and the transistors Q3 and Q4 of the second amplifier 630 can neglect voltage drops across the resistors RBB3, RBB4, RE1 and RE2.

Figure 6:
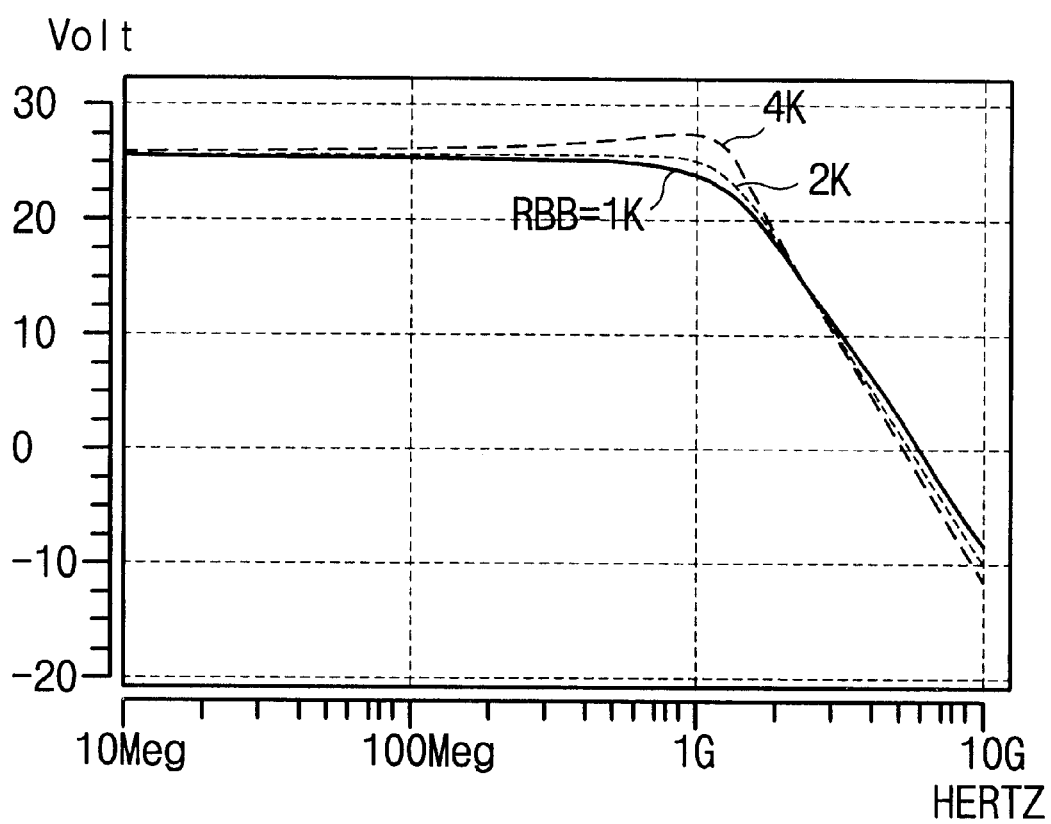
FIG. 6 is a schematic plot which illustrates output characteristics of the input buffer shown in FIG. 5.

FIG. 6 is a schematic plot illustrating output characteristics of the input buffer shown in FIG. 5. The input buffer circuit 650 is simulated by a circuit simulation computer program, such as SPICE, with VDD=3V, VBB1=1.5V, VBB2=3V, IEE1'=IEE2'=100 μA, RL3=RL4=1.75 kΩ, and RE1=RE2=0.1 kΩ.

Figure 4:
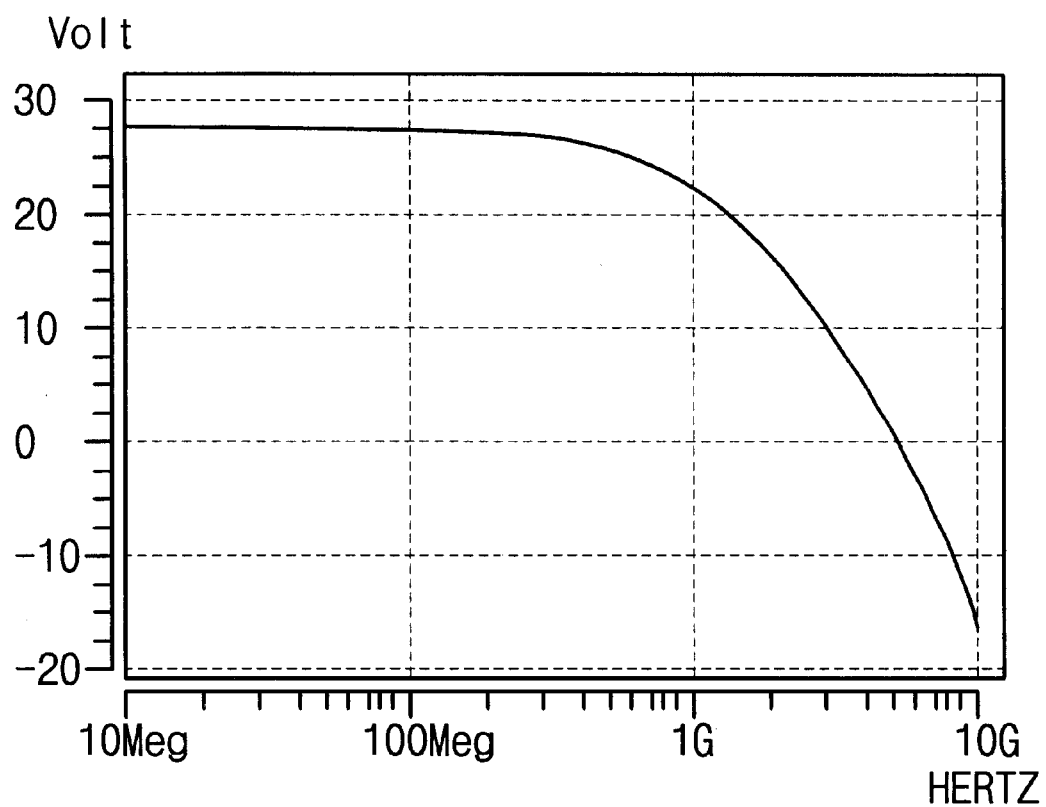
FIG. 4 is a schematic plot which illustrates output characteristics of the input buffer shown in FIG. 3.

Referring to FIG. 6, a passband flatness of the input buffer circuit 650 is superior to that of the conventional input buffer circuit 65 shown in FIGS. 3 and 4. In addition, the input buffer circuit 650 can control the flatness at a band edge by adjusting the resistance of the resistors RBB3 and RBB4. Further, the input buffer circuit 650 has the gain above 10 dB and sufficiently wide bandwidth.

As described above, the input buffer circuit 650 comprises the first amplifier 620 having low load impedance and the second amplifier 630 having high load impedance. Thus, the output signals OUT and OUTB of the input buffer circuit 650 have wide bandwidth, although the input buffer circuit 650 has two stage amplifiers 620 and 630. In addition, the bandwidth can be controlled by the resistors RBB3 and RBB4 used as equivalent active inductance of the input buffer circuit 650. Further, the loading circuit 610 loads the third and the fourth switching voltages VN3 and VN4 into the output driving circuit 640 by using both switching currents IEE1' and IEE2', so that the input buffer circuit 650 can reduce the power consumption to about half of that compared with the conventional input buffer circuit 65 shown in FIG. 3.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. An input buffer circuit of a prescaler for pre-dividing an oscillating signal having a radio band frequency in a frequency divider of a radio frequency phase-locked loop (RF PLL), the input buffer circuit comprising: switching circuit receiving a first switching current from a power supply voltage source, switching the first switching current in response to the oscillating signal, and generating first and second switching signals by converting the first switching current into first and second switching voltages;

second switching means for receiving a second switching current from the power supply voltage source and switching the second switching current, in response to the first and the second switching signals;

loading means coupled to the second switching means for generating third and fourth switching signals by converting both the first and second switching currents into third and fourth switching voltages; and output driving means for outputting first and second output signals in response to the third and fourth switching signals, respectively.

2. The input buffer circuit of claim 1, wherein:

the loading section of the first switching means provides the first and second switching signals to the second switching means by converting the first switching current into the first and the second switching voltages in response to the switching operation of the switching circuit of the first switching means; and the cascode transistors are in cascode with the loading section to supply the first switching current for the switching circuit through the loading section without loss.

3. The input buffer circuit of claim 2, wherein the switching circuit comprises:

a first switching transistor, having a control electrode to receive an inverted oscillating signal and a bias current, and a current path, for switching the first switching current in response to the inverted oscillating signal;

a second switching transistor, having a control electrode to receive the oscillating signal and a bias current, and a current path, for switching the first switching current in response to the oscillating signal, wherein the oscillating signal is a non-inverted oscillating signal;

a first resistor for delivering the bias current from a first bias voltage source into the control electrode of the first switching transistor;

a second resistor for delivering the bias current from the first bias voltage source into the control electrode of the second switching transistor; and a current sinker coupled between the current paths of the first and second switching transistors and a ground voltage source, for sinking the first switching current in response to the switching operation of the first and second switching transistors.

4. The input buffer circuit of claim 3, wherein the cascode circuit comprises:

a first cascode transistor, having a control electrode to receive a bias current and a current path coupled to the loading section, for supplying the first switching current for the loading section without loss;

a second cascode transistor, having a control electrode to receive a bias current and a current path coupled to the loading section, for supplying the first switching current for the loading section without loss;

a third resistor for delivering the bias current from a second bias voltage source into the control electrode of the first cascode transistor; and a fourth resistor for delivering the bias current from the second bias voltage source into the control electrode of the second cascode transistor.

5. The input buffer circuit of claim 4, wherein the third and the fourth resistors are worked as an equivalent inductance when the frequency of the oscillating signal is high, so that the output bandwidth of the input buffer circuit can be controlled by the resistors.

6. The input buffer circuit of claim 4, wherein the loading section comprises:

a fifth resistor, coupled between the current path of the first cascode transistor and the current path of the first switching transistor, for delivering the first switching current from the first cascode transistor to the first switching transistor and generating the first switching signal in response to the switching operation of the first switching transistor; and a sixth resistor, coupled between the current path of the second cascode transistor and the current path of the second switching transistor, for delivering the first switching current from the second cascode transistor to the second switching transistor and generating the second switching signal in response to the switching operation of the second switching transistor.

7. The input buffer circuit of claim 3, wherein the second switching means comprises:

a third switching transistor, having a control electrode to receive the first switching signal from the first switching means and a current path, for switching the second switching current in response to the first switching signal;

a fourth switching transistor, having a control electrode to receive the second switching signal from the first switching means and a current path, for switching the second switching current in response to the second switching signal; and a current sinker coupled between the current paths of the third and fourth switching transistors and the ground voltage source, for sinking the second switching current in response to the switching operation of the third and fourth switching transistors.

8. The input buffer circuit of claim 7, wherein the loading means comprises:

a first loading resistor coupled between the power supply voltage source and the current paths of the second cascode transistor and the third switching transistor, for generating the third switching signal by converting both the first and the second switching currents into the third switching voltage in response to the switching operation of the second switching means; and a second loading resistor coupled between the power supply voltage source and the current paths of the first cascode transistor and the fourth switching transistor, for generating the fourth switching signal by converting both the first and the second switching currents into the fourth switching voltage in response to the switching operation of the second switching means.

9. The input buffer circuit of claim 3, wherein the output driving means comprises:

a first output transistor having a control electrode to receive the third switching signal, and a current path coupled between the power supply voltage source and a first output terminal, wherein the first output terminal outputs the first output signal of the input buffer circuit in response to the third switching signal;

a second output transistor having a control electrode to receive the fourth switching signal, and a current path coupled between the power supply voltage source and a second output terminal, wherein the second output terminal outputs the second output signal of the input buffer circuit in response to the fourth switching signal;

a third current sinker coupled between the first output electrode and the ground voltage source, for sinking a current from the current path of the first output transistor; and a fourth current sinker coupled between the second output electrode and the ground voltage source, for sinking a current from the current path of the second output transistor.

10. The input buffer circuit of claim 1, wherein the first switching means, second switching means, and output driving means comprise a plurality of bipolar junction transistors (BJTs).

11. An input buffer circuit of a prescaler for pre-dividing an oscillating signal having a radio band frequency in a frequency divider of a radio frequency phase-locked loop (RF PLL), the input buffer circuit comprising:

first switching means including a loading circuit and cascode transistors in cascode with the loading circuit, for receiving a first switching current from a power supply voltage source, switching the first switching current in response to the oscillating signal, and generating a first and a second switching signal by converting the first switching current into a first and a second switching voltage;

second switching means for receiving a second switching current from the power supply voltage source and switching the second switching current, in response to the first and the second switching signal;

loading means coupled to the second switching means for generating a third and a fourth switching signal by converting both the first and the second switching currents into a third and a fourth switching voltage; and output driving means for outputting a first and a second output signal in response to the third and the fourth switching signal, respectively, wherein:

the first switching means comprises a switching circuit for selectively switching the first switching current in response to the oscillating signal;

the loading circuit generates the first and the second switching signal into the second switching means by converting the first switching current into the first and the second switching voltage, respectively, in response to the switching operation of the switching circuit; and the cascode transistors are in a cascode circuit in cascode with the loading circuit for supplying the first switching current for the switching circuit through the loading circuit without loss, the switching circuit comprising:

a first switching transistor, having a control electrode to receive an inverted oscillating signal and a bias current, and a current path, for switching the first switching current in response to the inverted oscillating signal;

a second switching transistor, having a control electrode to receive the oscillating signal and a bias current, and a current path, for switching the first switching current in response to the oscillating signal, wherein the oscillating signal is a non-inverted oscillating signal;

a first resistor for delivering the bias current from a first bias voltage source into the control electrode of the first switching transistor;

a second resistor for delivering the bias current from the first bias voltage source into the control electrode of the second switching transistor; and a current sinker coupled between the current paths of the first and second switching transistors and a ground voltage source, for sinking the first switching current in response to the switching operation of the first and second switching transistors.

12. The input buffer circuit of claim 11, wherein the cascode circuit comprises:

a first cascode transistor, having a control electrode to receive a bias current and a current path coupled to the loading circuit, for supplying the first switching current for the loading circuit without loss;

a second cascode transistor, having a control electrode to receive a bias current and a current path coupled to the loading circuit, for supplying the first switching current for the loading circuit without loss;

a third resistor for delivering the bias current from a second bias voltage source into the control electrode of the first cascode transistor; and a fourth resistor for delivering the bias current from the second bias voltage source into the control electrode of the second cascode transistor.

13. The input buffer circuit of claim 12, wherein the third and the fourth resistors are worked as an equivalent inductance when the frequency of the oscillating signal is high, so that the output bandwidth of the input buffer circuit can be controlled by the resistors.

14. The input buffer circuit of claim 12, wherein the loading circuit comprises:

a fifth resistor, coupled between the current path of the first cascode transistor and the current path of the first switching transistor, for delivering the first switching current from the first cascode transistor to the first switching transistor and generating the first switching signal in response to the switching operation of the first switching transistor; and a sixth resistor, coupled between the current path of the second cascode transistor and the current path of the second switching transistor, for delivering the first switching current from the second cascode transistor to the second switching transistor and generating the second switching signal in response to the switching operation of the second switching transistor.

15. The input buffer circuit of claim 11, wherein the second switching means comprises:

a third switching transistor, having a control electrode to receive the first switching signal from the first switching means and a current path, for switching the second switching current in response to the first switching signal;

a fourth switching transistor, having a control electrode to receive the second switching signal from the first switching means and a current path, for switching the second switching current in response to the second switching signal; and a current sinker coupled between the current paths of the third and fourth switching transistors and the ground voltage source, for sinking the second switching current in response to the switching operation of the third and fourth switching transistors.

16. The input buffer circuit of claim 15, wherein the loading means comprises:

a first loading resistor coupled between the power supply voltage source and the current paths of the second cascode transistor and the third switching transistor, for generating the third switching signal by converting both the first and the second switching currents into the third switching voltage in response to the switching operation of the second switching means; and a second loading resistor coupled between the power supply voltage source and the current paths of the first cascode transistor and the fourth switching transistor, for generating the fourth switching signal by converting both the first and the second switching currents into the fourth switching voltage in response to the switching operation of the second switching means.

17. The input buffer circuit of claim 11, wherein the output driving means comprises:
- a first output transistor having a control electrode to receive the third switching signal, and a current path coupled between the power supply voltage source and a first output terminal, wherein the first output terminal outputs the first output signal of the input buffer circuit in response to the third switching signal;
- a second output transistor having a control electrode to receive the fourth switching signal, and a current path coupled between the power supply voltage source and a second output terminal, wherein the second output terminal outputs the second output signal of the input buffer circuit in response to the fourth switching signal;
- a third current sinker coupled between the first output electrode and the ground voltage source, for sinking a current from the current path of the first output transistor; and
- a fourth current sinker coupled between the second output electrode and the ground voltage source, for sinking a current from the current path of the second output transistor.

* * * * *

UNITED STATES PATENT AND TRADEMARK OFFICE
CERTIFICATE OF CORRECTION

PATENT NO. : 6,392,452 B2
DATED : May 21, 2002
INVENTOR(S) : Sang-Oh Lee

It is certified that error appears in the above-identified patent and that said Letters Patent is hereby corrected as shown below:

Column 8,
Line 58, after "switching circuit receiving", please insert -- first switching means including a switching circuit, a loading section and a cascode circuit including cascode transistors in cascode with the loading section, the loading section being connected between the switching circuit and the cascode circuit, the --.

Signed and Sealed this

Nineteenth Day of April, 2005

JON W. DUDAS
*Director of the United States Patent and Trademark Office*